United States Patent
Li et al.

(10) Patent No.: US 10,727,438 B2
(45) Date of Patent: Jul. 28, 2020

(54) OLED COMPONENT AND METHOD FOR MANUFACTURING THE SAME

(71) Applicant: Shenzhen China Star Optoelectronics Technology Co., Ltd., Shenzhen, Guangdong (CN)

(72) Inventors: Wenjie Li, Guangdong (CN); Tsung Yuan Wu, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 427 days.

(21) Appl. No.: 15/550,486

(22) PCT Filed: Jul. 4, 2017

(86) PCT No.: PCT/CN2017/091664
§ 371 (c)(1),
(2) Date: Aug. 11, 2017

(87) PCT Pub. No.: WO2018/223473
PCT Pub. Date: Dec. 13, 2018

(65) Prior Publication Data
US 2019/0386239 A1     Dec. 19, 2019

(30) Foreign Application Priority Data

Jun. 8, 2017   (CN) .......................... 2017 1 0429192

(51) Int. Cl.
*H01L 51/52*   (2006.01)
*H01L 27/32*   (2006.01)
(Continued)

(52) U.S. Cl.
CPC ........ *H01L 51/525* (2013.01); *H01L 27/3246* (2013.01); *H01L 51/0005* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 6,699,728 B2 | 3/2004 | Guenther et al. |
| 7,564,067 B2 * | 7/2009 | Cok .................. B82Y 20/00 257/81 |

(Continued)

FOREIGN PATENT DOCUMENTS

| CN | 104538558 A | 4/2015 |
| CN | 106783933 A | 5/2017 |

OTHER PUBLICATIONS

Search Report and Written Opinion, dated Mar. 15, 2018, for International Application No. PCT/CN2017/091664.

*Primary Examiner* — Lex H Malsawma

(57) ABSTRACT

An OLED component is disclosed, which relates to the technical field of display panel. The OLED component comprises a TFT substrate, a coating zone, a sealant, a cover and a photo spacer. The coating zone is located at a center of the TFT substrate; the sealant is arranged around the coating zone; the cover is arranged above the coating zone and the sealant; and the photo spacer is arranged on an upper surface of the coating zone for supporting the cover. Since the photo spacer is arranged on the upper surface of the coating zone, an alignment accuracy can be improved, and the OLED component can be easily manufactured. Meanwhile, a cell thickness uniformity of a large-sized panel can be maintained, and occurrence of Newton rings can be avoided.

11 Claims, 2 Drawing Sheets

(51) Int. Cl.
*H01L 51/00* (2006.01)
*H01L 51/56* (2006.01)

(56) References Cited

U.S. PATENT DOCUMENTS

| | | |
|---|---|---|
| 7,633,218 B2 | 12/2009 | Cok |
| 8,237,356 B2 * | 8/2012 | Cho ...................... H01L 27/322 |
| | | 313/112 |
| 2006/0290276 A1 * | 12/2006 | Cok ...................... H01L 27/322 |
| | | 313/512 |
| 2014/0027729 A1 * | 1/2014 | So ........................ H01L 51/5056 |
| | | 257/40 |
| 2016/0190220 A1 | 6/2016 | Hsu |
| 2016/0276618 A1 | 9/2016 | Sun et al. |
| 2016/0293688 A1 * | 10/2016 | Chen .................. H01L 27/3279 |

* cited by examiner

OLED COMPONENT AND METHOD FOR MANUFACTURING THE SAME

CROSS-REFERENCE TO RELATED APPLICATIONS

This application claims the priority of Chinese patent application CN201710429192.1, entitled "OLED component and method for manufacturing the same" and filed on Jun. 8, 2017, the entirety of which is incorporated herein by reference.

FIELD OF THE INVENTION

The present disclosure relates to the technical field of display, and in particular, to an OLED component and a method for manufacturing the same.

BACKGROUND OF THE INVENTION

Organic light emitting diode (OLED) component has been widely used for its advantages such as good self-luminescence, high contrast, rapid response, and flexible display. A traditional OLED is made through vacuum evaporation technology. At present, mass production can be realized. However, in the technology, a fine mask is needed, which leads to low material utilization. Besides, with respect to large-sized panels, there are many challenges in the manufacturing technology of the mask. In recent years, printing display technology (ink jet printing, IJP) has been developed rapidly. IJP is a best way to realize large-size and low cost production of OLED.

To produce an OLED by IJP, it is necessary to modify a pixel definition layer and a substrate electrode, so that ink can fall into a pixel accurately and no overflow phenomenon occurs. In the prior art, flow spread of ink droplets in different cross sections is researched, and a substrate is performed by hydrophilic or hydrophobic patterning. The droplets will flow to a hydrophilic interface at a certain landing speed, and has a function of forming a trace pattern. Therefore, the substrate electrode and the pixel definition layer which contact the ink can be performed by hydrophilic or hydrophobic patterning (the substrate electrode is an ITO, i.e., a hydrophilic surface, while the pixel definition layer is a hydrophobic surface), so that the ink flows into the pixel.

In a process of manufacturing an OLED component, in order to prevent the cover from damaging the OLED component (for example, a cathode layer, a polarizer, etc.) when the cover is impacted by an external force, and to enable the entire component to have a certain pressure resistance, in the prior art, a plurality of photo spacers are usually arranged on a TFT substrate. The photo spacers have another function, i.e., they can maintain a cell thickness uniformity of a large-sized panel so as to avoid the occurrence of Newton rings.

A surface of the pixel definition layer on the substrate used in the OLED produced by IJP is hydrophobic, and a photo spacer is usually made of an organic photoresist, which cannot spread on a hydrophobic surface. In general, the photo spacer is formed on the cover. In this manner, there is a high requirement for an alignment accuracy of a device, and thus the device is difficult to be manufactured.

SUMMARY OF THE INVENTION

In order to solve the above problem, according to the present disclosure, a photo spacer is arranged on a protection layer of an OLED cathode by an ink jet printing technology, so that a cell thickness uniformity of a large-sized panel can be maintained, and occurrence of Newton rings can be avoided.

The present disclosure provides an OLED component, which comprises a TFT substrate, a coating zone, a sealant, a cover, and a photo spacer. The coating zone is located at a center of the TFT substrate; the sealant is arranged around the coating zone; the cover is arranged above the coating zone and the sealant; and the photo spacer is arranged on an upper surface of the coating zone for supporting the cover.

In the OLED component, the coating zone comprises a plurality of pixel definition layers and a plurality of substrate electrode layers that are arranged alternately. A surface of each substrate electrode layer is covered with an organic semiconductor layer, and the organic semiconductor layer and each pixel definition layer are covered with a cathode layer and a protection layer from bottom to top in sequence. An upper surface of the protection layer which is located at a center of the pixel definition layer is provided with the photo spacer thereon.

In the OLED component, a surface of the pixel definition layer near the organic semiconductor layer is hydrophobic.

In the OLED component, a surface of the substrate electrode layer near the organic semiconductor layer is hydrophilic.

In the OLED component, the photo spacer is made of an organic macromolecule polymer, and the organic macromolecule polymer is a high viscosity polymer.

In the OLED component, a viscosity of the high viscosity polymer is in a range from 200 Pa·s to 2000 Pa·s.

In the OLED component, a height of the photo spacer is in a range from 2 to 20 μm, and a width thereof is in a range from 1 to 100 μm.

The present disclosure provides a method for manufacturing an OLED component, which comprises steps of:

step 1, forming substrate electrode layers on a TFT substrate, and performing hydrophilic treatment on surfaces of the substrate electrode layers;

step 2, forming pixel definition layers on the TFT substrate, and performing hydrophobic treatment on surfaces of the pixel definition layers;

step 3, forming an organic semiconductor layer on each substrate electrode layer;

step 4, forming a cathode layer on surfaces of each pixel definition layer and the organic semiconductor layer;

step 5, forming a protection layer on a surface of the cathode layer;

step 6, forming a photo spacer on an upper surface of the protection layer which is located at a center of the pixel definition layer; and step 7, coating a sealant around the TFT substrate, and covering a cover on a coating zone to complete packaging.

According to the method for manufacturing the OLED component, the organic semiconductor layer comprises a hole injection layer, a hole transmission layer, an electron injection layer, and an electron transmission layer, and wherein at least one of the hole injection layer, the hole transmission layer, the electron injection layer, and the electron transmission layer is prepared by an inkjet printing technology.

According to the method for manufacturing the OLED component, the photo spacer is coated by an UV glue extruded from a nozzle on the upper surface of the protection layer which is located at the center of the pixel definition layer, and a curing is performed simultaneously with the coating to form the photo spacer.

The present disclosure has the following advantages. The photo spacer is arranged on the protection layer of the OLED cathode by the ink jet printing technology, and the manufacturing method is simple and feasible.

BRIEF DESCRIPTION OF THE DRAWINGS

The present disclosure will be illustrated in detail hereinafter with reference to the embodiments and the accompanying drawings. In the drawings.

Figure 1:
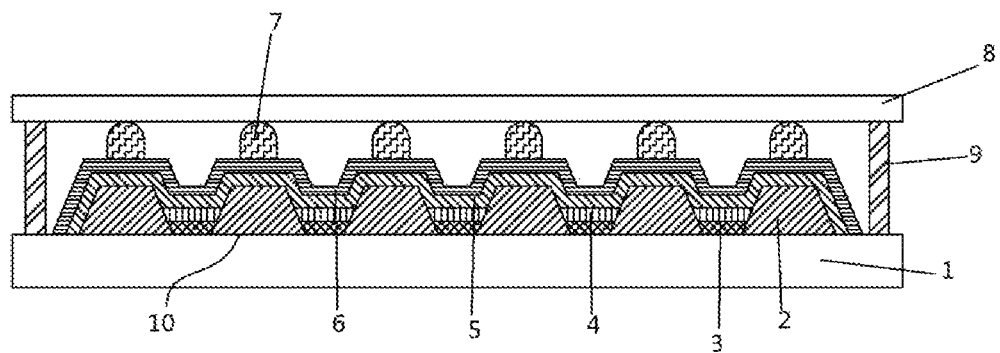
FIG. 1 schematically shows a structure of an OLED component according to the present disclosure.

In the drawings, the same components are represented by the same reference signs, and the size of each component does not represent the actual size of the corresponding component.

DETAILED DESCRIPTION OF THE EMBODIMENTS

The present disclosure will be further illustrated hereinafter with reference to the drawings.

FIG. 1 schematically shows a structure of an OLED component according to the present disclosure. The OLED component comprises a TFT substrate 1, a coating zone 10, a sealant 9, a cover 8 and a photo spacer 7.

The coating zone 10 is located at a center of the TFT substrate; the sealant 9 is arranged around the coating zone 10; the cover 8 is arranged above the coating zone 10 and the sealant 9; and the photo spacer 7 is arranged on an upper surface of the coating zone 10 for supporting the cover 8. Since the photo spacer is arranged on the upper surface of the coating zone, a cell thickness uniformity of a large-sized panel can be maintained and occurrence of Newton rings can be avoided. In this manner, disadvantages in the prior art, such as high requirement for an alignment accuracy of a device and implementing difficulties thereof when the photo spacer is arranged on the cover, can be avoided.

The coating zone 10 comprises a plurality of pixel definition layers 2 and a plurality of substrate electrode layers 3 that are arranged alternately on the TFT substrate 1. A surface of each substrate electrode layer 3 is covered with an organic semiconductor layer 4, and the organic semiconductor layer 4 and each pixel definition layer 2 are covered with a cathode layer 5 and a protection layer 6 from bottom to top in sequence. An upper surface of the protection layer 6 which is located at a center of the pixel definition layer 2 is provided with the photo spacer 7 thereon for supporting the cover 8. Since the photo spacer is arranged on the upper surface of the protection layer which is located at the center of the pixel definition layer 2, a cell thickness uniformity of a large-sized panel can be maintained and occurrence of Newton rings can be avoided. In this manner, disadvantages in the prior art, such as high requirement for an alignment accuracy of a device and implementing difficulties thereof when the photo spacer is arranged on the cover, can be avoided.

A substrate electrode is etched to form a plurality of substrate electrode layers 3 having trapezoid cross sections with a same distance thereamong. Each substrate electrode layer 3 has a same cross section, and a minor base of the trapezoid contacts the TFT substrate. Photoresist layers are coated between each two adjacent substrate electrode layers and between the substrate electrode layers and an edge of the TFT substrate to form a plurality of pixel definition layers 2, and each pixel definition layer 2 has a trapezoid cross section. An organic semiconductor layer 4 is formed on an upper surface of the substrate electrode layer 3, and the organic semiconductor layer 4 is located between two adjacent pixel definition layers 2. A thickness of the pixel definition layer 2 is larger than a sum of a thickness of the organic semiconductor layer 4 and a thickness of the substrate electrode layer 3. The organic semiconductor layer 4 comprises a hole injection layer, a hole transmission layer, an electron injection layer and an electron transmission layer (which are not shown in FIG. 1). A cathode layer 5 and a protection layer 6 are arranged on upper surfaces of the pixel definition layer 2 and the organic semiconductor layer 4 in sequence. A height of the photo spacer is in a range from 2 to 20 μm, and a width thereof is in a range from 1 to 100 μm.

A surface of the pixel definition layer 2 near the cathode layer 5 is hydrophobic.

A surface of the substrate electrode layer 3 near the organic semiconductor layer 4 is hydrophilic.

The photo spacer 7 is made of an organic macromolecule polymer, and the organic macromolecule polymeris a high viscosity polymer.

A viscosity of the high viscosity polymer is in a range from 200 Pa·s to 2000 Pa·s, and the polymer can be one selected from a group consisting of acrylic, epoxy resin, and polydimethoxane.

The protection layer is an inorganic water-proof layer, and a material thereof can be one selected from a group consisting of silicon oxide, silicon nitride, aluminum oxide, titanium dioxide, zinc oxide, or cerium oxide. The protection layer can be formed by technologies such as plasma enhanced chemical vapor deposition, atomic layer deposition and vacuum sputtering.

Figure 2:
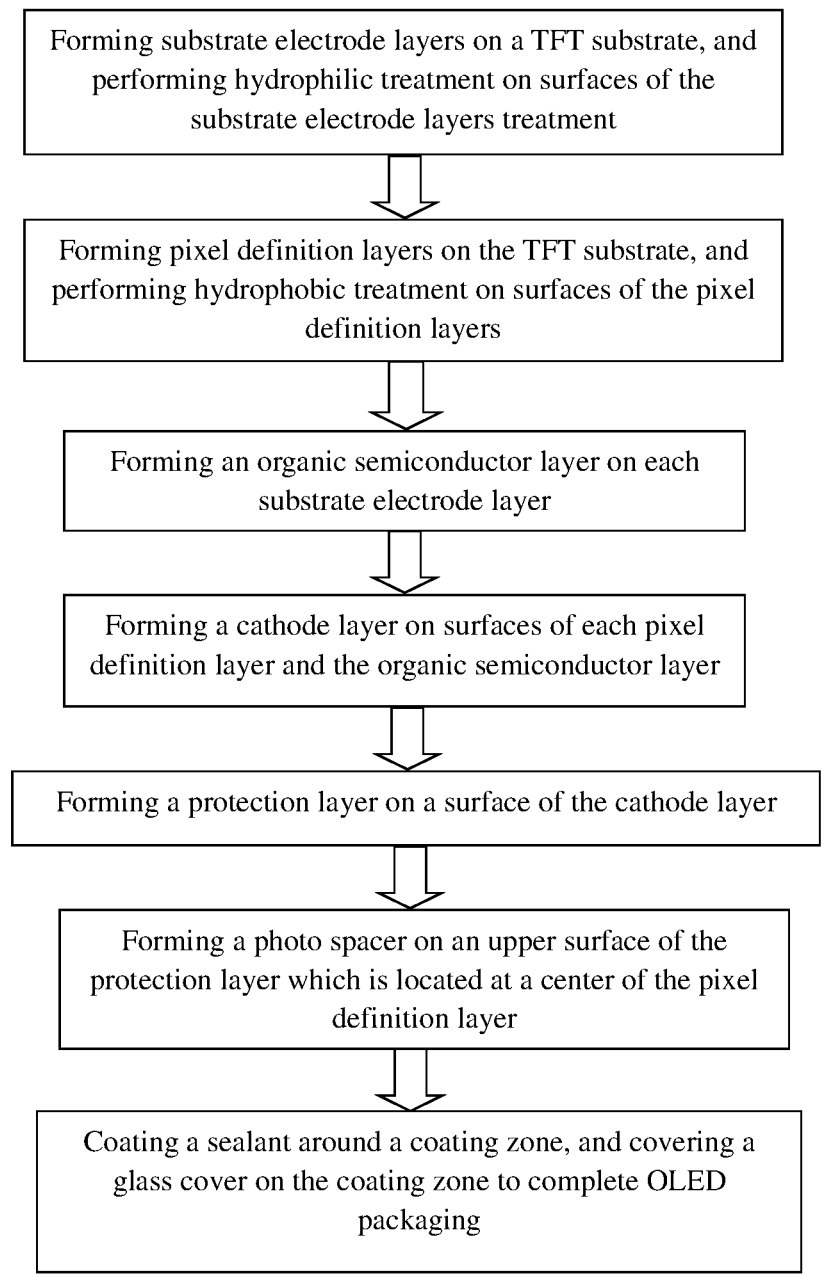
FIG. 2 is a flow chart of a method for manufacturing the OLED component according to the present disclosure.

FIG. 2 shows a method for manufacturing the OLED component according to the present disclosure, which comprises following steps.

In step 1, substrate electrode layers are formed on a TFT substrate, and surfaces of the substrate electrode layers are performed by hydrophilic treatment. Each of the substrate electrode layers has a transparent conductive property, and the substrate electrode layer is made of ITO. After the ITO is formed, a surface thereof is performed by hydrophilic treatment. A technology of irradiating appropriate UV light, or a plasma technology, and all technologies of surface modification can be used.

In step 2, pixel definition layers are formed on the TFT substrate, and surfaces of the pixel definition layers are performed by hydrophobic treatment. The photoresist comprises free F atoms. After exposure and development procedures, the F atoms return to the surface of the pixel definition layer. Therefore, the surface of the pixel definition layer is hydrophobic.

In step 3, an organic semiconductor layer is formed on the substrate electrode layer.

In step 4, a cathode layer is formed on surfaces of each pixel definition layer and the organic semiconductor layer. That is, a cathode of the component is formed by a vapor deposition technology.

In step 5, a protection layer is formed on a surface of the cathode layer. The protection layer can be produced by technologies such as plasma enhanced chemical vapor deposition, atomic layer deposition, and vacuum sputtering.

In step 6, a photo spacer is formed on an upper surface of the protection layer which is located at a center of the pixel definition layer.

In step 7, a sealant is coated around the TFT substrate, and a cover is covered on a coating zone to complete packaging.

The organic semiconductor layer comprises a hole injection layer, a hole transport transmission layer, an electron injection layer, and an electron transport layer; and wherein at least one of the hole injection layer, the hole transmission layer, the electron injection layer, and the electron transmission layer is prepared by an inkjet printing technology.

The photo spacer is coated by an UV glue extruded from a nozzle on the upper surface of the protection layer which is located at the center of the pixel definition layer, and a curing is performed simultaneously with the coating to form the photo spacer.

At last, it should be noted that, the above embodiments are only used for illustrating, rather than restricting the present disclosure. The present disclosure is illustrated in detail in combination with preferred embodiments hereinabove, but it can be understood that, the embodiments disclosed herein can be amended or substituted without departing from the protection scope of the present disclosure. The protection scope of the present disclosure shall be determined by the scope as defined in the claims.

The invention claimed is:

1. An OLED component, comprising:
   a TFT substrate;
   a coating zone;
   a sealant;
   a cover; and
   a photo spacer,
   wherein the coating zone is arranged on a surface of the TFT substrate and is located at a center of the TFT substrate;
   wherein the sealant is arranged on the TFT substrate surrounding the coating zone;
   wherein the cover is arranged above the coating zone and affixed to the sealant; and
   wherein the photo spacer is arranged on an upper surface of the coating zone for supporting the cover;
   wherein the coating zone comprises a plurality of pixel definition layers and a plurality of substrate electrode layers that are arranged alternately on the TFT substrate;
   wherein a surface of each substrate electrode layer is covered with an organic semiconductor layer;
   wherein the organic semiconductor layer and each pixel definition layer are covered with a cathode layer, and a protection layer is directly disposed on the cathode layer; and
   wherein the photo spacer is directly arranged on and contacts with an upper surface of the protection layer which is located at a center of the pixel definition layer without contacting with the pixel definition layer.

2. The OLED component according to claim 1, wherein a surface of the pixel definition layer near the organic semiconductor layer is hydrophobic.

3. The OLED component according to claim 1, wherein a surface of the substrate electrode layer near the organic semiconductor layer is hydrophilic.

4. The OLED component according to claim 1, wherein the photo spacer is made of an organic macromolecule polymer, and the organic macromolecule polymer is a high viscosity polymer.

5. The OLED component according to claim 4, wherein a viscosity of the high viscosity polymer is in a range from 200 Pas to 2000 Pas.

6. The OLED component according to claim 1, wherein a height of the photo spacer is in a range from 2 to 20 μm, and a width thereof is in a range from 1 to 100 μm.

7. The OLED component according to claim 1, wherein the cathode layer is covered by the protection layer without contacting with the photo spacer.

8. The OLED component according to claim 1, wherein a portion of the cathode layer is sandwiched between the organic semiconductor layer and the protection layer, and a remaining portion of the cathode layer is sandwiched between the pixel definition layer and the protection layer.

9. A method for manufacturing an OLED component, comprising steps of:
   step 1, forming substrate electrode layers on a TFT substrate, and performing hydrophilic treatment on surfaces of the substrate electrode layers;
   step 2, forming pixel definition layers on the TFT substrate, and performing hydrophobic treatment on surfaces of the pixel definition layers;
   step 3, forming an organic semiconductor layer on each substrate electrode layer;
   step 4, forming a cathode layer on surfaces of each pixel definition layer and the organic semiconductor layer;
   step 5, forming a protection layer on a surface of the cathode layer;
   step 6, forming a photo spacer on an upper surface of the protection layer which is located at a center of the pixel definition layer; and
   step 7, coating a sealant around the TFT substrate, and covering a cover on a coating zone to complete packaging.

10. The method according to claim 9, wherein the organic semiconductor layer comprises a hole injection layer, a hole transmission layer, an electron injection layer, and an electron transmission layer; and
   wherein at least one of the hole injection layer, the hole transmission layer, the electron injection layer, and the electron transmission layer is prepared by an inkjet printing technology.

11. The method according to claim 9, wherein the photo spacer is coated by an UV glue extruded from a nozzle on the upper surface of the protection layer which is located at the center of the pixel definition layer, and a curing is performed simultaneously with the coating to form the photo spacer.

* * * * *